US009767952B2

(12) United States Patent
Hamamura et al.

(10) Patent No.: US 9,767,952 B2
(45) Date of Patent: Sep. 19, 2017

(54) MAGNETIC SENSOR AND CURRENT SENSOR INCLUDING THE SAME

(71) Applicant: TDK Corporation, Tokyo (JP)

(72) Inventors: Takahiro Hamamura, Tokyo (JP); Takashi Osada, Tokyo (JP); Masafumi Kami, Tokyo (JP); Adrian Lo, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 15/337,402

(22) Filed: Oct. 28, 2016

(65) Prior Publication Data
US 2017/0125151 A1 May 4, 2017

(30) Foreign Application Priority Data

Nov. 2, 2015 (JP) ................. 2015-215419

(51) Int. Cl.
G01R 33/04 (2006.01)
H01F 27/26 (2006.01)
H01F 27/29 (2006.01)
H01F 27/28 (2006.01)
G01R 15/18 (2006.01)
H01F 17/04 (2006.01)

(52) U.S. Cl.
CPC ......... *H01F 27/266* (2013.01); *G01R 15/183* (2013.01); *G01R 33/04* (2013.01); *H01F 27/2823* (2013.01); *H01F 27/29* (2013.01); *H01F 17/04* (2013.01)

(58) Field of Classification Search
CPC ................. G01R 33/04; H01F 17/04
USPC ............................. 324/253, 207.15
See application file for complete search history.

(56) References Cited

U.S. PATENT DOCUMENTS 5,287,056 A 2/1994 Jackson et al.
6,373,366 B1 * 4/2002 Sato ............... H01F 17/045
336/192

(Continued)

FOREIGN PATENT DOCUMENTS

CN 103268804 A 8/2013
JP 2000-269050 A 9/2000

(Continued)

OTHER PUBLICATIONS

JPO Office Action dated May 31, 2016 in JP Serial No. 2015-215419.

(Continued)

*Primary Examiner* — Reena Aurora
(74) *Attorney, Agent, or Firm* — Young Law Firm, P.C.

(57) ABSTRACT

Disclosed herein is a magnetic sensor including: a first core made of a first soft magnetic material, the first core having first and second connection surfaces; a second core made of a second soft magnetic material different from the first soft magnetic material, the second core having a third connection surface facing the first connection surface and a fourth connection surface facing the second connection surface; and a coil wound around the first core between the first connection surface and the second connection surface. The first core reaches magnetic saturation at a higher magnetic field intensity than that of the second core, and the second core has a higher magnetic permeability than that of the first core.

13 Claims, 15 Drawing Sheets

(56) References Cited

U.S. PATENT DOCUMENTS

| | | | | |
|---|---|---|---|---|
| 6,965,289 B2* | 11/2005 | Toi | ..................... | H01F 27/365 336/200 |
| 9,041,500 B2* | 5/2015 | Moiseev | ................ | H01F 17/04 336/131 |
| 2006/0066292 A1 | 3/2006 | Tadatsu | | |
| 2014/0028431 A1* | 1/2014 | Lee | ..................... | H01F 3/02 336/212 |

FOREIGN PATENT DOCUMENTS

| | | |
|---|---|---|
| JP | 2010-010354 A | 1/2010 |
| JP | 2011/112634 A | 6/2011 |
| JP | 2011-112634 A | 6/2011 |
| JP | 2012-238743 A | 12/2012 |
| JP | 2012-256669 A | 12/2012 |
| WO | 03081271 A1 | 10/2003 |
| WO | 2007060961 A1 | 5/2007 |
| WO | 2009/093178 A1 | 7/2009 |

OTHER PUBLICATIONS

JPO Decision to Grant a Patent dated Sep. 13, 2016 in JP Serial No. 2015-215419.

* cited by examiner

MAGNETIC SENSOR AND CURRENT SENSOR INCLUDING THE SAME

BACKGROUND OF THE INVENTION

Field of the Invention

The present invention relates to a magnetic sensor and a current sensor including the magnetic sensor, and more particularly relates to a fluxgate magnetic sensor and a current sensor including the fluxgate magnetic sensor.

Description of Related Art

A fluxgate magnetic sensor is known as a magnetic sensor that detects an external magnetic field. International Publication WO2009/093178 and Japanese Patent Application Laid-open No. 2011-112634 describe examples of the fluxgate magnetic sensor.

The fluxgate magnetic sensor described in International Publication WO2009/093178 has a configuration in which a coil is wound around a fluxgate core made of an amorphous magnetic metal or the like, and can detect a magnetic field occurring according to a current flowing through a bus bar. However, the fluxgate magnetic sensor described in International Publication WO2009/093178 has an open magnetic circuit structure and thus the number of windings of the coil needs to be increased to obtain a sufficient inductance, which is not suitable for downsizing.

Japanese Patent Application Laid-open No. 2011-112634 discloses a fluxgate magnetic sensor having a closed magnetic circuit structure. The fluxgate magnetic sensor described in Japanese Patent Application Laid-open No. 2011-112634 has a low resistance portion made of permalloy and a high resistance portion made of ferrite, which are joined together in a ring shape to provide the closed magnetic circuit structure. In Japanese Patent Application Laid-open No. 2011-112634, the fluxgate magnetic sensor is formed by winding a coil around the low resistance portion made of permalloy.

However, because the coil is wound around the low resistance portion made of permalloy in the fluxgate magnetic sensor described in Japanese Patent Application Laid-open No. 2011-112634, there is a problem that the measurement range of the magnetic sensor is restricted by the saturation flux density of the lower resistance portion and the measurement range is narrow.

SUMMARY

It is therefore an object of the present invention to provide a fluxgate magnetic sensor having a closed magnetic circuit structure and a wide measurement range, and a current sensor including the fluxgate magnetic sensor.

A magnetic sensor according to the present invention includes: a first core that is made of a first soft magnetic material and that has first and second connection surfaces; a second core that is made of a second soft magnetic material different from the first soft magnetic material and that has a third connection surface facing the first connection surface and a fourth connection surface facing the second connection surface; and a coil that is wound around the first core between the first connection surface and the second connection surface. The first core reaches magnetic saturation at a higher magnetic field intensity than that of the second core, and the second core has a higher magnetic permeability than that of the first core.

A current sensor according to the present invention includes: a bus bar through which a current to be measured flows; the magnetic sensor described above and placed near the bus bar; and a detection circuit that monitors a voltage appearing on the coil.

According to the present invention, the first and second cores constitute a closed magnetic circuit structure and the coil is wound around the first core reaching magnetic saturation at a higher magnetic field intensity than that of the second core. Therefore, even in such a magnetic field that the second core is magnetically saturated, the magnetic characteristics can be maintained. Accordingly, a magnetic sensor having a high inductance and a wide measurement range, and a current sensor including the magnetic sensor can be provided.

In the present invention, it is preferable that the first core is a drum core comprising a winding core portion around which the coil is wound, and first and second flange portions provided on both ends of the winding core portion in an axial direction, respectively, the first flange portion has a first terminal electrode to which one end of the coil is connected, the second flange portion has a second terminal electrode to which the other end of the coil is connected, a surface of the first flange portion parallel to the axial direction forms the first connection surface, and a surface of the second flange portion parallel to the axial direction forms the second connection surface. Accordingly, a drum core that is widely used in a surface-mounting coil component can be used and thus the cost can be reduced.

In this case, the coil can comprise first and second coils, at least parts of which are bifilar wound, or can comprise first and second coils, the numbers of turns of which are different from each other. This enables one of the coils to be used as an exciting coil and the other coil to be used as a detecting coil.

In the present invention, it is preferable that the second core is a plate-like body covering the first and second connection surfaces. Accordingly, a magnetic sensor can be constituted only by connecting a plate-like body to a drum core having a coil wound therearound.

In this case, a width of the second core in a direction orthogonal to the axial direction can be narrower at a central portion located between the third connection surface and the fourth connection surface than those at the third and fourth connection surfaces. Accordingly, magnetic saturation becomes more likely to occur at the central portion having the narrower width and thus the sensitivity can be enhanced.

In the present invention, the second core can have a stack structure in a thickness direction. This can enlarge a range in which the magnetic field can be measured with a high sensitivity while suppressing eddy-current loss. Furthermore, a length of the second core in the axial direction can be larger than that of the first core in the axial direction. Accordingly, more magnetic fluxes pass through the second core and therefore the detection sensitivity can be enhanced.

In the present invention, it is preferable that the first core and the second core are positioned with respect to each other without an adhesive interposed therebetween. This prevents stress caused by contraction of the adhesive or the like from being applied onto the second core and thus magnetic characteristics as designed can be provided.

In this case, a support member that positions the second core with respect to the first core can be further comprised, and the support member can have an engaging portion that engages with the first core, which positions the second core to be sandwiched between the support member and the first core. Alternatively, a support member that positions the second core with respect to the first core can be further comprised, the support member can have an adhesion surface on which a recessed portion housing the second core therein is provided, and the adhesion surface of the support member can be bonded to the first and second connection surfaces of the first core, which positions the second core to be sandwiched between the recessed portion of the support member and the first core.

In the present invention, the first core can further comprise a third flange portion that is located between the first flange portion and the second flange portion in the axial direction, and the second core can be placed to cover surfaces of the first to third flange portions. This can prevent flexure of the second core even in a case where a length of the winding core portion in the axial direction is large.

In the present invention, it is preferable that the first soft magnetic material is ferrite and the second soft magnetic material is an amorphous magnetic metal. Accordingly, a magnetic sensor manufactured at a low cost and with a high sensitivity, and a current sensor comprising the magnetic sensor can be provided.

As described above, according to the present invention, a fluxgate magnetic sensor having a high inductance due to a closed magnetic circuit structure and also having a wide measurement range, and a current sensor including the fluxgate magnetic sensor can be provided.

BRIEF DESCRIPTION OF THE DRAWINGS

The above features and advantages of the present invention will be more apparent from the following description of certain preferred embodiments taken in conjunction with the accompanying drawings, in which:

FIG. 1A is a perspective view showing an external appearance, FIG. 1B is a side view cut along a plane A in FIG. 1A, and FIG. 1C is an exploded perspective view;

FIG. 13A shows characteristics in a range in which the magnetic flux density B is between −200 mT to 200 mT and FIG. 13B shows characteristics in a range in which the magnetic flux density B is between −10 mT to 10 mT;

DETAILED DESCRIPTION OF THE EMBODIMENTS

Preferred embodiments of the present invention will be explained below in detail with reference to the accompanying drawings.

Figures 1A, 1B:
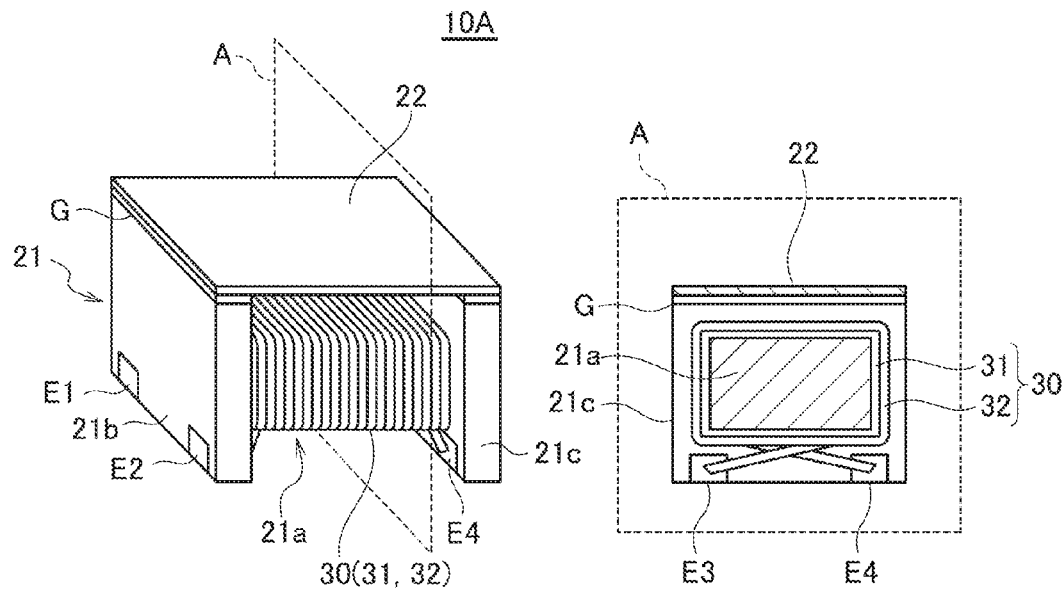
FIGS. 1A to 1C show a configuration of a magnetic sensor 10A according to a first embodiment of the present invention, where
Figure 1C:
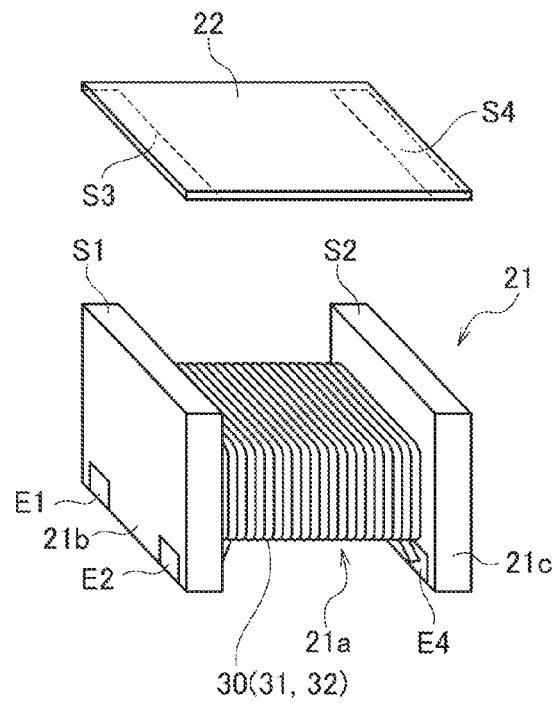

FIGS. 1A to 1C show a configuration of a magnetic sensor 10A according to a first embodiment of the present invention, where FIG. 1A is a perspective view showing an external appearance, FIG. 1B is a side view cut along a plane A in FIG. 1A, and FIG. 1C is an exploded perspective view.

The magnetic sensor 10A according to the first embodiment is a fluxgate magnetic sensor that can be surface mounting and includes a first core 21 of a drum-shaped, a second core 22 of a plate-shaped, and a coil 30 (31 and 32) wound around the first core 21 as shown in FIGS. 1A to 1C.

The first core 21 is made of a soft magnetic material such as ferrite and has a winding core portion 21a around which the coil 30 is wound, and first and second flange portions 21b and 21c provided on both ends of the winding core portion 21a in the axial direction, respectively. The flange portions 21*b* and 21*c* have a larger diameter than that of the winding core portion 21*a* viewed in the axial direction, which facilitates an operation of winding the coil 30 and prevents fall-off of the coil 30. One or more terminal electrodes are provided for each of the flange portions 21*b* and 21*c*, and one end and the other end of the coil 30 are connected to the corresponding terminal electrodes. In the example shown in FIGS. 1A to 1C, the coil 30 includes two coils 31 and 32 and one end of each of these coils 31 and 32 is connected to terminal electrodes E1 and E2 provided on the flange portion 21*b*, respectively, and the other ends thereof are connected to terminal electrodes E3 and E4 provided on the flange portion 21*c*, respectively.

Figure 2:
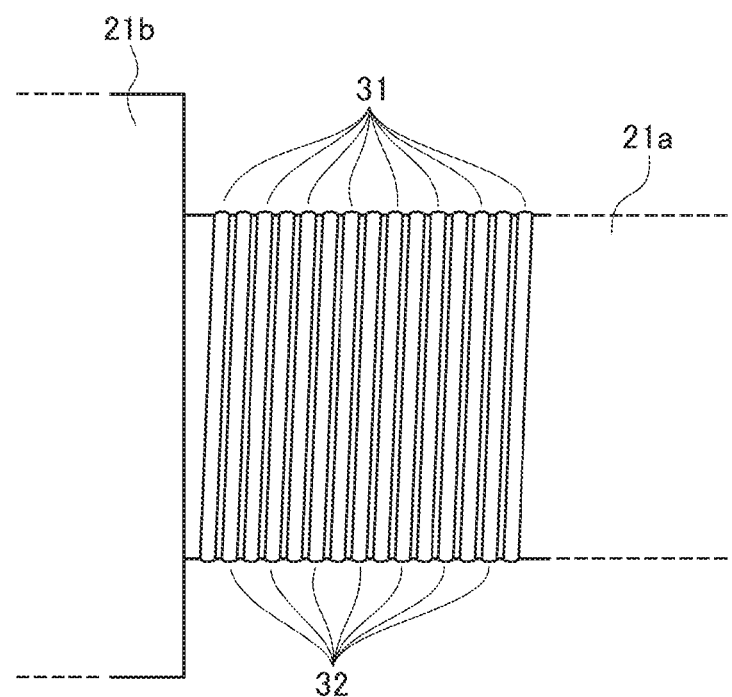
FIG. 2 shows an example that two coils are wound in bifilar.

When the coil 30 includes the two coils 31 and 32, the numbers of turns of these two coils 31 and 32 can be the same or different from each other. When the numbers of turns of the two coils 31 and 32 are the same, it is preferable to bifilar wind the coils 31 and 32 as shown in FIG. 2. This can strengthen magnetic coupling with the coils 31 and 32.

The flange portions 21*b* and 21*c* of the first core 21 have first and second connection surfaces S1 and S2 facing the second core 22, respectively. The connection surfaces S1 and S2 are planes parallel to the axial direction of the winding core portion 21*a* and are top surfaces located on the opposite side to bottom surfaces on which the terminal electrodes E1 to E4 are formed. The terminal electrodes E1 to E4 are formed also on side surfaces orthogonal to the axis direction as well as on the bottom surfaces to enable fillet of soldering to be formed at the time of surface mounting.

The second core 22 is a plate-like body made of a soft magnetic material such as amorphous magnetic metal. The second core 22 covers the connection surfaces S1 and S2 and is fixed thereto via an adhesion layer G made of a resin adhesive such as an epoxy resin adhesive in the first embodiment. A part of the second core 22 facing the first connection surface S1 forms a third connection surface S3 and another part thereof facing the second connection surface S2 forms a fourth connection surface S4. Therefore, in the first embodiment, the adhesion layer G is interposed between the connection surface S1 and the connection surface S3 and the adhesion layer G is interposed between the connection surface S2 and the connection surface S4.

With this configuration, the first core 21 and the second core 22 constitute a closed magnetic circuit and the coil 30 is wound around the first core 21. The coil 30 is not wound around the second core 22. Because the first core 21 and the second core 22 constitute the closed magnetic circuit in this way, a higher inductance can be achieved with a smaller number of windings relative to an open magnetic circuit structure as described in International Publication WO2009/093178. Conversely, a smaller number of turns suffices to achieve the same inductance in a closed magnetic circuit structure.

The first core 21 reaches magnetic saturation at a higher magnetic field intensity than that of the second core 22 and is made of a soft magnetic material having a lower magnetic permeability than that of the second core 22. That is, a magnetic material that can apply a larger magnetic field until the saturation flux density is achieved than that of the second core 22 is selected. Although not particularly limited, the soft magnetic material that forms the first core 21 can be Mn—Zn ferrite, Ni—Zn ferrite, sendust, permalloy, or the like and it is particularly preferable to use Ni—Zn ferrite. Because having a high insulating resistance, Ni—Zn ferrite is not electrically short-circuited even when the coil 30 is directly wound therearound. Meanwhile, in a case where Mn—Zn ferrite or the like having a low insulating resistance is used, short-circuiting may occur when the film of the coil 30 peels off for some reason and therefore it is preferable to perform processing for increasing the insulating property, such as parylene coating, to the surface of the first core 21.

The second core 22 reaches magnetic saturation at a lower magnetic field intensity than that of the first core 21 and is made of a soft magnetic material having a higher magnetic permeability than that of the first core 21. Although not particularly limited, a Fe/Co amorphous magnetic metal is preferably used as the material of the second core 22. In a case where a Fe/Co amorphous magnetic metal is used, the Fe/Co amorphous magnetic metal is preferably formed by a roll-to-roll method into a thin plane having a thickness equal to or smaller than 50 μm. When the roll-to-roll method is used, a heated raw material of an amorphous magnetic plate is cooled rapidly through contact with a roll having a large heat capacity. At that time, a surface being in contact with the roll and a surface not being in contact with the roll are different in temperature histories and thus have a difference in compositions. Accordingly, one of the surfaces becomes a high gloss surface and the other surface becomes a low gloss surface. In the first embodiment, it is preferable to place the second core 22 in such a manner that the low gloss surface faces the first core 21. This placement provides satisfactory magnetic coupling between the first core 21 and the second core 22 and can suppress a reduction in the inductance.

Because the Fe/Co amorphous magnetic metal is relatively fragile, it is difficult to wind the coil 30 around the Fe/Co amorphous magnetic metal. However, in the first embodiment, the coil 30 is wound around the first core 21 having a relatively high mechanical strength and the coil 30 is not wound around the second core 22. Therefore, the thickness of the Fe/Co amorphous magnetic metal can be reduced, for example, to be equal to or smaller than 50 μm.

Figure 3:
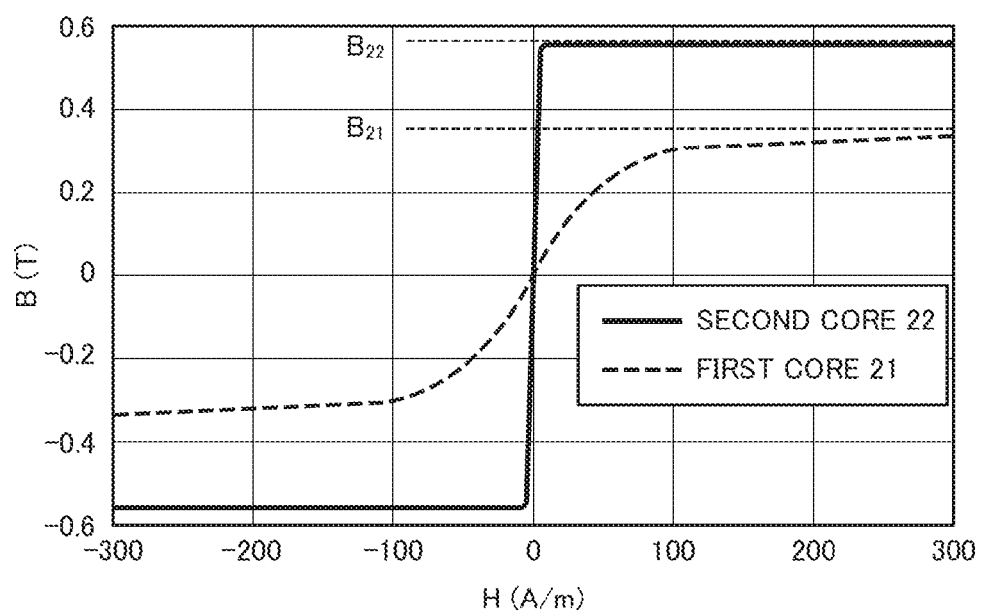
FIG. 3 is a graph showing magnetic characteristics of a first core and a second core.

FIG. 3 is a graph showing magnetic characteristics of the first core 21 and the second core 22.

As shown in FIG. 3 in which the horizontal axis represents the magnetic field intensity H (A/m) and the vertical axis represents the flux density B (T), a relation between a saturation flux density $B_{21}$ of the first core 21 and a saturation flux density $B_{22}$ of the second core 22 in a case of assuming only ideal magnetization without considering hysteresis characteristics is:

$$B_{21} < B_{22}.$$

On the other hand, a magnetic field intensity at which the saturation flux density is achieved is sufficiently larger in the first core 21 than in the second core 22. Accordingly, the magnetic flux density of a closed magnetic circuit constituted by the first core 21 and the second core 22 steeply changes at a magnetic field intensity at which the second core 22 is not magnetically saturated and gradually changes at a magnetic field intensity at which the second core 22 is magnetically saturated.

One of major characteristics of the magnetic sensor 10A according to the first embodiment is that the coil 30 is wound only around the first core 21. If the coil 30 is wound around the second core 22, the measurement range of the magnetic sensor is restricted by magnetic saturation of the second core 22 and a measurable magnetic field intensity range is narrowed. This problem occurs in the magnetic sensor described in Japanese Patent Application Laid-open No. 2011-112634. In contrast thereto, because the coil 30 is wound around the first core 21 reaching the magnetic saturation at a high magnetic field intensity in the magnetic sensor 10A according to the first embodiment, highlysensitive detection can be performed by the second core 22 in a weak magnetic field in which the second core 22 is not completely saturated. Furthermore, even in an intense magnetic field in which the second core 22 is completely saturated, detection can be performed using the magnetic characteristics of the first core 21 unless the first core 21 is completely saturated.

The amount of magnetic saturation can be adjusted by a gap between the first core 21 and the second core 22. The size of the gap can be controlled by the thickness of the adhesion layer G. To form a gap having a desired size, it suffices to fix a positional relation between the first core 21 and the second core 22 during a process of solidifying a liquid of a resin adhesive being a source of the adhesion layer G.

Figure 4:
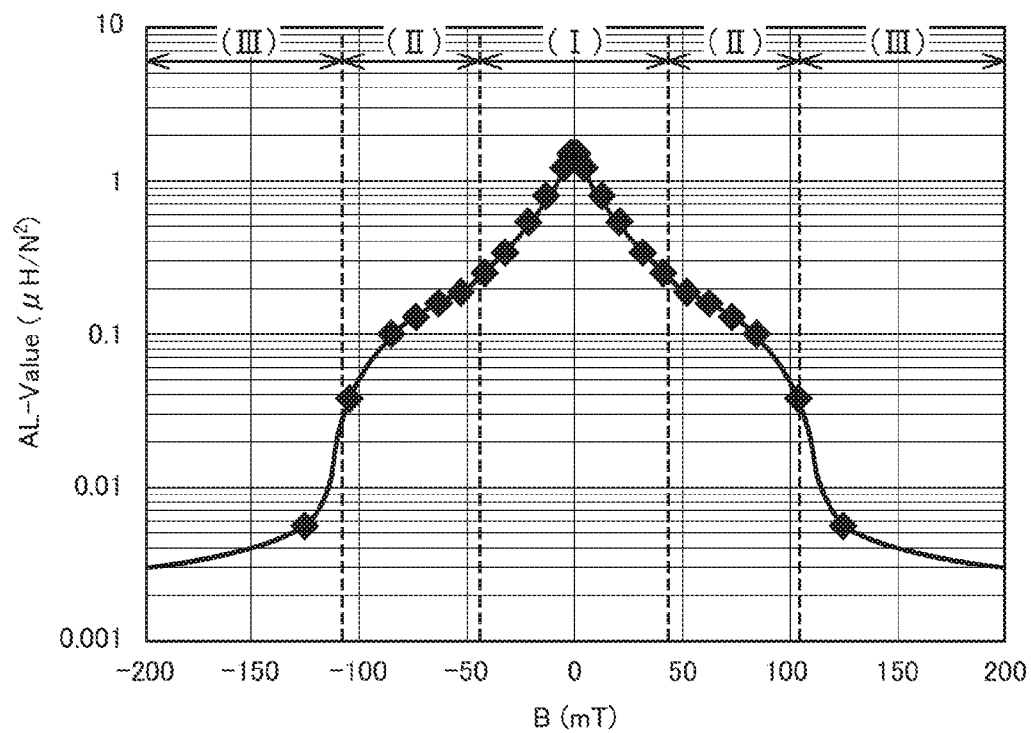
FIG. 4 is a graph showing magnetic characteristics of the magnetic sensor according to a first embodiment of the present invention.

FIG. 4 is a graph showing magnetic characteristics of the magnetic sensor 10A according to the first embodiment.

As shown in FIG. 4 in which the horizontal axis represents the magnetic flux density B (mT) and the vertical axis represents the inductance (AL-Value) per turn of the coil 30, three regions according to the magnetic flux density can be defined. A first region (I) is a region in which the inductance changes steeply and corresponds to a range in which the second core 22 is not magnetically saturated. A second region (II) is a region in which the inductance changes gradually and corresponds to a range in which the second core 22 is magnetically saturated and the first core 21 is not magnetically saturated. A third region (III) is a region in which the inductance changes little and corresponds to a range in which the first core 21 is magnetically saturated. The magnetic sensor functions in the first region (I) and the second region (II). Out of these regions, measurement with a higher sensitivity can be performed in the first region (I).

While the first region (I) is a region in which neither the first core 21 nor the second core 22 is magnetically saturated, the magnetic characteristics of the second core 22 appear more remarkably than those of the first core 21 because the magnetic permeability (=dB/dH) of the second core 22 made of an amorphous magnetic metal or the like is considerably higher than that of the first core 21 made of ferrite or the like in the first region (I). According to definition of the inductance, the inductance is proportional to the magnetic permeability and thus also becomes high under a condition in which the magnetic permeability is high. As described above, the second core 22 made of an amorphous magnetic metal or the like has a high magnetic permeability and is easily magnetically saturated. Therefore, a magnetic field (magnetic flux density) can be detected with quite a high sensitivity in the first region (I). However, because the amorphous magnetic metal is easily magnetically saturated, the magnetic permeability rapidly lowers and changes thereof become small.

The second region (II) is a region in which the magnetic permeability of the second core 22 made of an amorphous magnetic metal or the like is sufficiently low while the magnetic permeability of the first core 21 made of ferrite or the like is kept. The magnetic characteristics of the first core 21 are dominant in this region. While being lower in the magnetic permeability in a weak magnetic field region than that of the amorphous magnetic metal, ferrite has a wider magnetic field range in which the magnetic permeability can be kept as a trade-off. Therefore, the magnetic field (magnetic flux density) can be detected in the second region (II) by the magnetic characteristics of ferrite.

As explained above, in the magnetic sensor 10A according to the first embodiment, the first core 21 made of ferrite or the like and the second core 22 made of a Fe/Co amorphous magnetic metal or the like are connected in the shape of a ring to form a closed magnetic circuit and the coil 30 is wound around the first core 21 that is not easily magnetically saturated. Accordingly, detection with quite a high sensitivity can be performed using the magnetic characteristics of the second core 22 in a low magnetic flux density region, and changes in the inductance (AL-Value) can be maintained using the magnetic characteristics of the first core 21 also in a middle magnetic flux density region.

Furthermore, because using a drum core made of ferrite or the like as the first core 21, the magnetic sensor 10A according to the first embodiment can be manufactured at a low cost by diversion of a surface-mounting coil component. For example, a common mode filter, a pulse transformer, a transponder coil, or a normal mode (differential mode) coil can be diverted. In any case, it suffices to bond the second core 22 made of an amorphous magnetic metal or the like, instead of bonding a plate-like core made of ferrite or the like, to a drum core after winding the coil 30 around a winding core portion of the drum core. This enables a manufacturing line of other coil components to be used substantially as it is.

Figure 5:
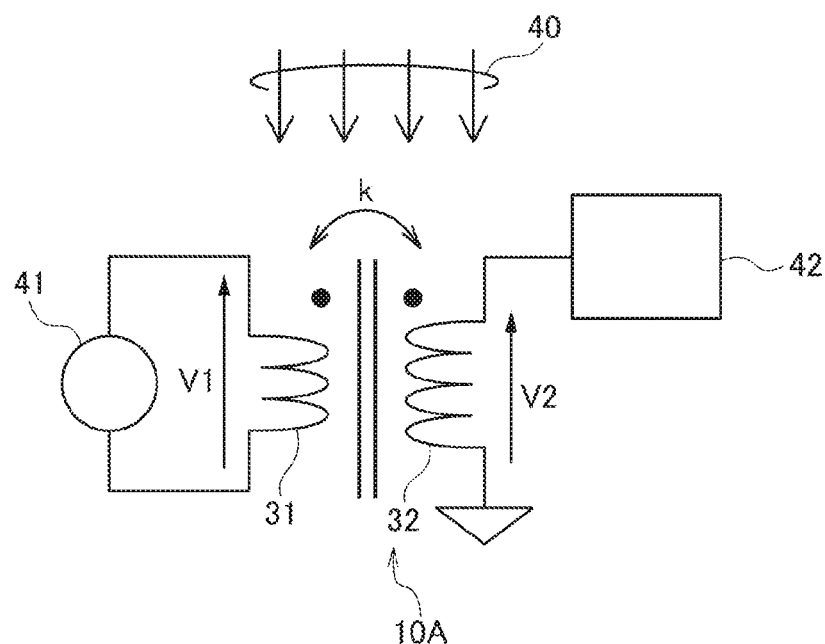
FIG. 5 is an equivalent circuit diagram showing a use example of the magnetic sensor according to the first embodiment of the present invention.

FIG. 5 is an equivalent circuit diagram showing a use example of the magnetic sensor 10A according to the first embodiment.

In the example shown in FIG. 5, the two coils 31 and 32 are wound in the magnetic sensor 10A, one of which is used as an exciting coil 31 and the other of which is used as a detecting coil 32. An inductance component of the exciting coil 31 and an inductance component of the detecting coil 32 are magnetically coupled with a predetermined magnetic coupling coefficient k. To be exact, there are resistance components of the coils 31 and 32 and the cores 21 and 22, such as copper loss and iron loss (hysteresis loss, eddy-current loss, and residual loss), and capacitance components such as parasitic capacitance. However, to simplify explanations, these components are not illustrated in the equivalent circuit shown in FIG. 5.

A signal generation circuit 41 is connected to the exciting coil 31. The signal generation circuit 41 is a circuit capable of generating an input voltage V1 with a rectangular wave, a sine wave, or a triangular wave. One end of the detecting coil 32 is grounded and the other end thereof is connected to a detection circuit 42. Therefore, a detection voltage V2 applied to the both ends of the detecting coil 32 is input to the detection circuit 42.

While a ratio of the number of windings between the exciting coil 31 and the detecting coil 32 is not particularly limited, a case in which the number of turns in the detecting coil 32 is larger than that of the exciting coil 31 is assumed in the example shown in FIG. 5. The exciting coil 31 and the detecting coil 32 are magnetically coupled to each other with the predetermined magnetic coupling coefficient k. As the magnetic coupling coefficient k is larger, an electrical signal input to the exciting coil 31 propagates to the detecting coil 32 with less attenuated.

When an external magnetic field 40 is applied, the inductance of the exciting coil 31 and the inductance of the detecting coil 32 lower according to the characteristics shown in FIG. 4. As a result, a voltage waveform output to the detecting coil 32 changes according to the intensity of the external magnetic field 40.

Figure 6:
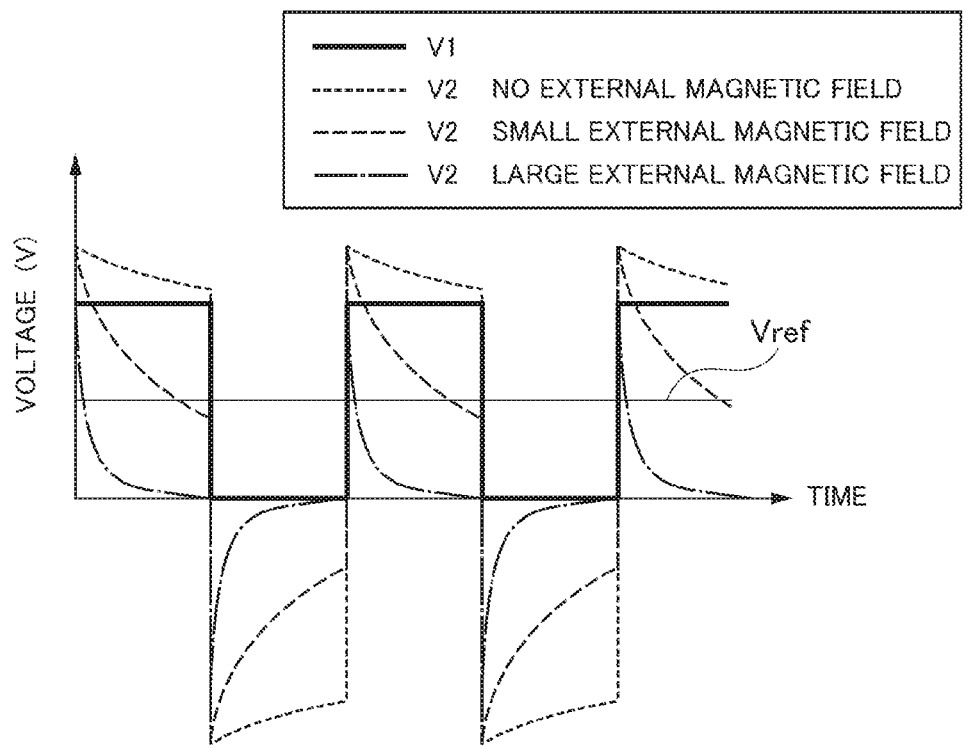
FIG. 6 is a waveform chart showing a relation between an external magnetic field and a detection voltage appearing on a detecting coil.

FIG. 6 is a waveform chart showing a relation between the external magnetic field 40 and the detection voltage V2 appearing on the detecting coil 32.

In an example shown in FIG. 6, the input voltage V1 with a rectangular wave is generated by the signal generation circuit 41 and is applied to the exciting coil 31.

First, in a case where there is no external magnetic field 40, the detection voltage V2 appearing on the detecting coil 32 becomes a rectangular wave having levels at flat portions slightly decreasing according to the time as indicated by a dotted line in FIG. 6. This decrease does not occur if there is no tendency of magnetic saturation. However, the magnetic sensor 10A is somewhat magnetically saturated due to a current from the signal generation circuit 41 and accordingly such a decrease occurs.

Next, in a case where the external magnetic field 40 is weak, saturation of the magnetic sensor 10A is accelerated by the external magnetic field 40 and the inductance value decreases more than that in the case where there is no external magnetic field 40, resulting in a waveform indicated by a broken line in FIG. 6.

Further, in a case where the external magnetic field is intense, the magnetic sensor 10A is more heavily saturated due to the external magnetic field 40 and the current from the signal generation circuit 41. Accordingly, the inductance value has a waveform steeply falling immediately after rising as indicated by a dashed dotted line in FIG. 6.

In this way, the waveform of the detection voltage V2 appearing on the detecting coil 32 changes according to the intensity of the external magnetic field 40. These changes are detected by the detection circuit 42 and the level of the external magnetic field 40 can be measured by analyzing the waveform of the detection voltage V2.

A comparator can be used as the detection circuit 42. A comparator is a circuit or an element that determines whether an input voltage is larger than a reference voltage Vref. When an comparator compares the detection voltage V2 with the reference voltage Vref, a period in which the detection voltage V2 exceeds the reference voltage Vref and a period in which the detection voltage V2 does not exceed the reference voltage Vref appear alternately in a half cycle in the case where these is no external magnetic field 40. Therefore, the duty of a signal output from the comparator is about 50%.

On the other hand, in the case where the external magnetic field 40 is weak, the period in which the detection voltage V2 exceeds the reference voltage Vref becomes shorter and correspondingly the period in which the detection voltage V2 does not exceed the reference voltage Vref becomes longer. In this case, the duty of the signal output from the comparator becomes lower than 50%.

In the case where the external magnetic field 40 is intense, the period in which the detection voltage V2 exceeds the reference voltage Vref becomes much shorter and correspondingly the period in which the detection voltage V2 does not exceed the reference voltage Vref becomes much longer. In this case, the duty of the signal output from the comparator becomes much lower than 50%.

As described above, as the external magnetic field 40 is more intense, the period in which the detection voltage V2 exceeds the reference voltage Vref becomes shorter and the duty of the signal output from the comparator correspondingly becomes lower. Therefore, when the duty of the signal output from the comparator is analyzed, the level of the external magnetic field 40 can be estimated.

Figure 7:
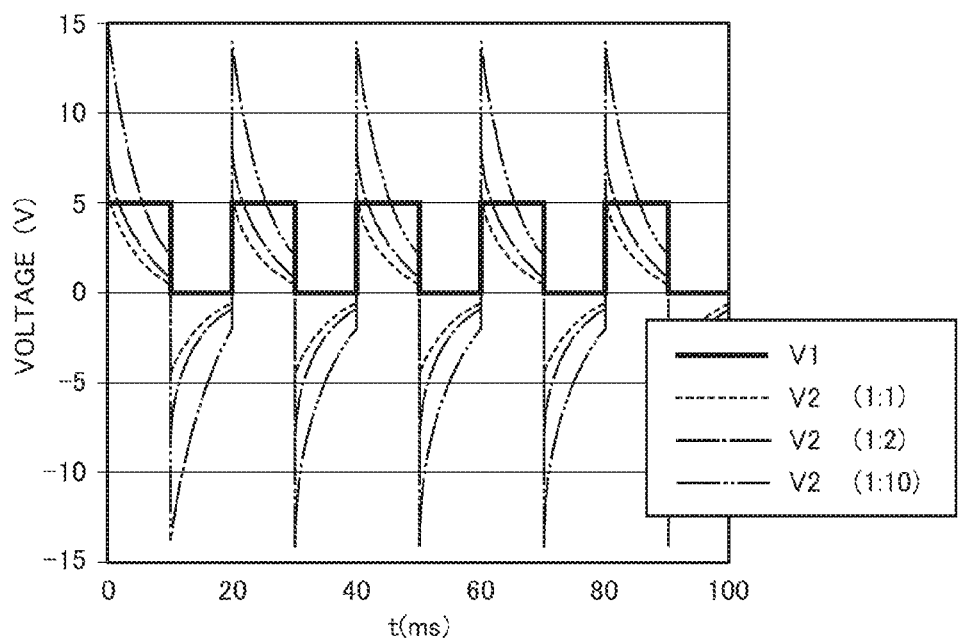
FIG. 7 is a graph showing a relation between the ratio of the number of windings between an exciting coil and a detecting coil and a detection voltage.

FIG. 7 is a graph showing a relation between the ratio of the number of windings between the exciting coil 31 and the detecting coil 32 and the detection voltage V2.

FIG. 7 shows that, as the ratio of the number of windings between the exciting coil 31 and the detecting coil 32 (the number of turns of the detecting coil 32/the number of turns of the exciting coil 31) is larger, a rising voltage of the detection voltage V2 is larger and a change amount thereof is also larger. That is, as the ratio of the number of windings is larger, a change in the detection voltage V2 can be detected more easily by the detection circuit 42. Accordingly, it is preferable that the number of turns in the detecting coil 32 is larger than the number of turns in the exciting coil 31.

Figure 8:
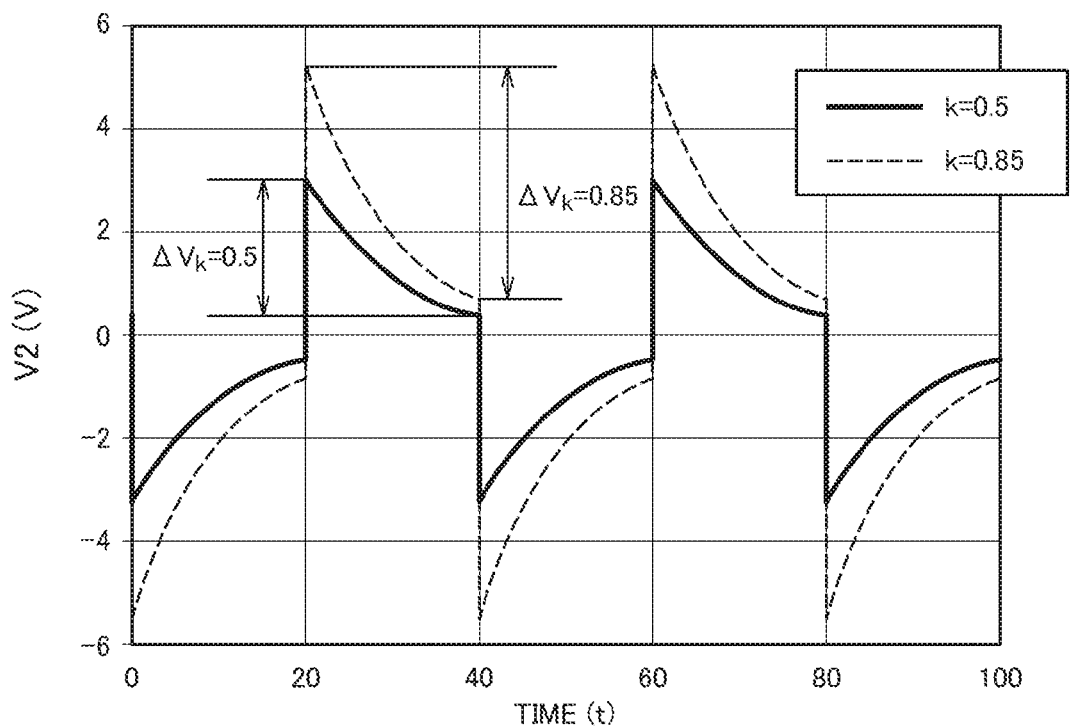
FIG. 8 is a graph showing a relation between a magnetic coupling coefficient k and a detection voltage.

FIG. 8 is a graph showing a relation between the magnetic coupling coefficient k and the detection voltage V2.

FIG. 8 illustrates a case where the magnetic coupling coefficient k is 0.5 and a case where the magnetic coupling coefficient k is 0.85. As is apparent from FIG. 8, as the magnetic coupling coefficient k is larger, a change amount $\Delta V$ of the detection voltage V2 appearing on the detecting coil 32 is larger. Therefore, it is preferable that the magnetic coupling coefficient k is large. To obtain a large magnetic coupling coefficient k, it is preferable to bifilar wind the exciting coil 31 and the detecting coil 32 as shown in FIG. 2. When the numbers of turns in the exciting coil 31 and the detecting coil 32 are different, it suffices to bifilar wind the exciting coil 31 and the detecting coil 32 in a range in which the numbers of turns are the same.

The circuit using the magnetic sensor 10A according to the first embodiment is not limited to that shown in FIG. 5 and other circuit configurations can be employed. For example, a circuit that measures a second-order harmonic of the detection voltage V2 occurring in the detecting coil 32 can be provided. The circuit that measures a second-order harmonic detects whether a voltage waveform has non-linear characteristics. When the input voltage V1 is applied to the exciting coil 31 in a case where the voltage waveform does not have non-linearity, odd-order harmonic components, that is, first-order, third-order, fifth-order, seventh-order, . . . harmonic components appear on the detecting coil 32. When the input voltage V1 is applied to the exciting coil 31 in a case where the voltage waveform is non-linear, even-order harmonic components, that is, second-order, fourth-order, sixth-order, . . . harmonic components as well as the odd-order harmonic components appear on the detecting coil 32. The non-linearity in this case mainly indicates non-linearity due to magnetic saturation characteristics of a magnetic body. That is, the second-order harmonic component among the even-order harmonic components caused by a magnetic saturation phenomenon is detected. Although high even-order harmonic components also appear, only the second-order harmonic component is generally used because changes tend to be smaller in higher-order harmonic components.

More specifically, when the input voltage V1 of a sine wave is applied by the signal generation circuit 41, a frequency of an even multiple of the frequency of the sine wave appears as the detection voltage V2 of the detecting coil 32 and the second-order harmonic thereof is detected. The detection can be realized by performing FFT (Fast Fourier Transform) using a DSP (Digital Signal Processor) or the like when the frequency is sufficiently low. Otherwise, the detection can be realized by extracting only the second-order harmonic component with a bandpass filter and averaging (smoothing) the component to be converted into a voltage and reading the resultant voltage with a DA (Digital-Analog) converter. When the input voltage V1 output from the signal generation circuit 41 has a sine wave, detection of the second-order harmonic component is easy to recognize; however, the input voltage V1 does not need to have a sine wave and can have a rectangular wave or a triangular wave.

Figure 9:
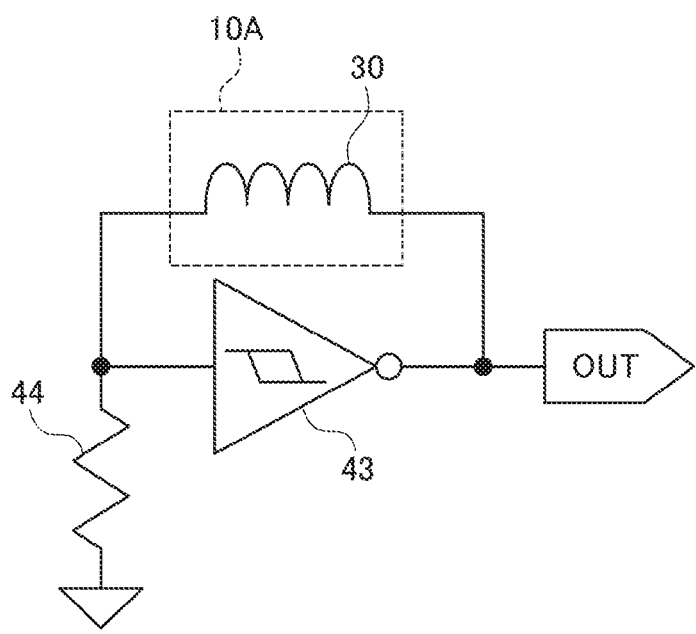
FIG. 9 is an equivalent circuit diagram showing another use example of the magnetic sensor according to the first embodiment of the present invention.

Furthermore, the external magnetic field 40 can be detected also when the coil 30 includes one coil, that is, there is no exciting coil 31. For example, a circuit in which the coil 30 of the magnetic sensor 10A is connected between an input terminal and an output terminal of a Schmitt trigger inverter 43 and further the input terminal of the Schmitt trigger inverter 43 is grounded via a resistor 44 as shown in FIG. 9 can be alternatively used. When the circuit shown in FIG. 9 is used, the frequency of a signal output from the Schmitt trigger 43 changes according to a change of the inductance of the coil 30 and thus the intensity of the external magnetic field 40 can be measured by analyzing the frequency of the signal.

Figure 10:
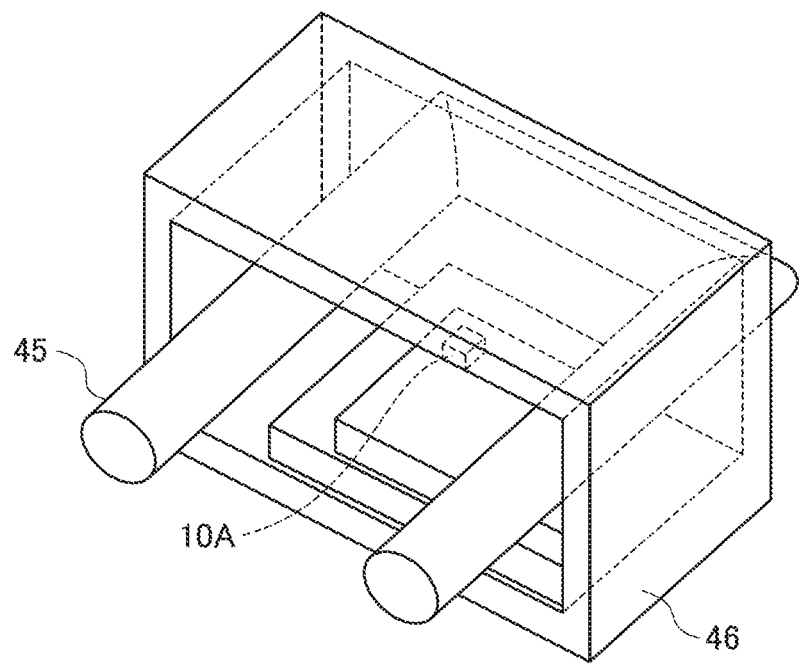
FIG. 10 is a schematic perspective view showing a configuration of a current sensor using the magnetic sensor according to the first embodiment of the present invention.

FIG. 10 is a schematic perspective view showing a configuration of a current sensor using the magnetic sensor 10A according to the first embodiment.

The current sensor shown in FIG. 10 has a configuration in which a bus bar 45 through which a current to be measured flows and a magnetic shield 46 are provided, and the magnetic sensor 10A according to the first embodiment is housed in the magnetic shield 46. The bus bar 45 is bent in a substantially horseshoe shape and the magnetic shield 46 is provided to surround the bent portion of the bus bar 45. The magnetic shield 46 is made of a magnetic material such as ferrite and functions to block an external magnetic field.

When the current to be measured is flowed through the bus bar 45, a magnetic field corresponding to the current amount occurs, which is detected by the magnetic sensor 10A. The detecting coil 32 of the magnetic sensor 10A is connected, for example, to the detection circuit 42 shown in FIG. 5 and a voltage thus appearing on the detecting coil 32 is monitored. This configuration enables the amount of the current flowing through the bus bar 45 to be detected by the magnetic sensor 10A. In this way, the magnetic sensor 10A according to the first embodiment can be used as a part of the current sensor.

Magnetic sensors according to other embodiments of the present invention are explained below.

Figure 11:
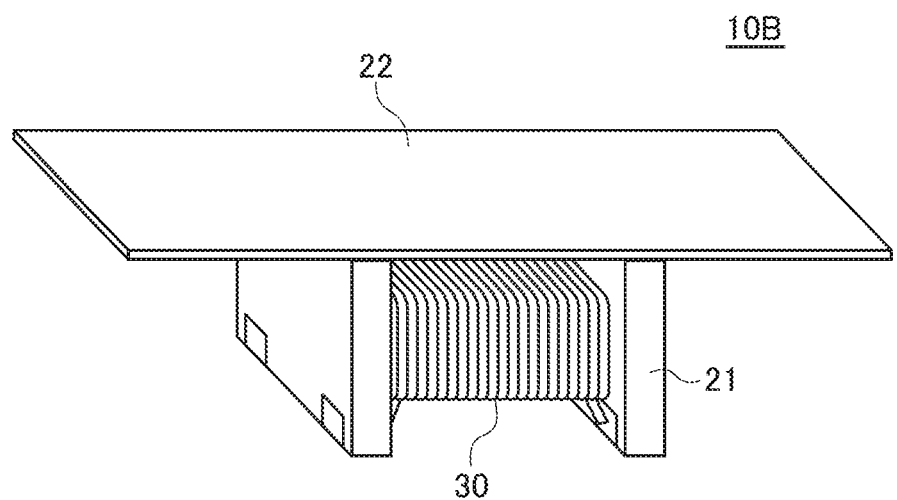
FIG. 11 is a perspective view showing a configuration of a magnetic sensor according to a second embodiment of the present invention.

FIG. 11 is a perspective view showing a configuration of a magnetic sensor 10B according to a second embodiment of the present invention.

The magnetic sensor 10B shown in FIG. 11 is different from the magnetic sensor 10A according to the first embodiment shown in FIG. 1 in that a length of the second core 22 in the axial direction is larger than that of the first core 21. Other features of the magnetic sensor 10B are identical to those of the magnetic sensor 10A according to the first embodiment, and thus like elements are denoted by like reference characters and redundant explanations thereof will be omitted.

Because the length of the second core 22 is increased in the axial direction in the magnetic sensor 10B according to the second embodiment, the external magnetic field can be captured more effectively. Accordingly, measurement with a higher sensitivity can be provided. Furthermore, because the directivity in the axial direction is enhanced, the magnetic sensor 10B also has an advantage that the direction of a measurement target object that generates a magnetic field can be easily specified.

Figure 12:
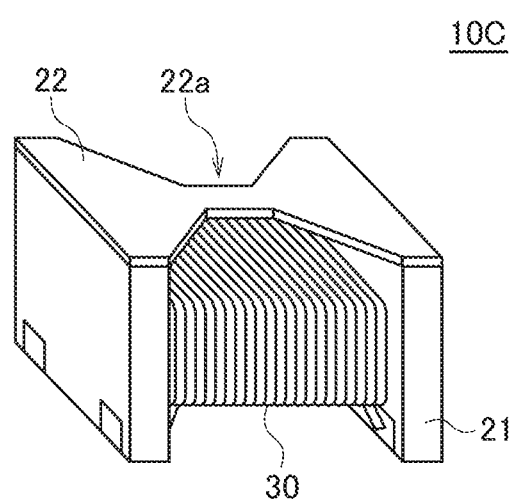
FIG. 12 is a perspective view showing a configuration of a magnetic sensor according to a third embodiment of the present invention.

FIG. 12 is a perspective view showing a configuration of a magnetic sensor 10C according to a third embodiment of the present invention.

The magnetic sensor 10C shown in FIG. 12 is different form the magnetic sensor 10A according to the first embodiment shown in FIG. 1 in that the width of the second core 22 is narrowed at a central portion 22a. That is, the width of the second core 22 is large at the connection surfaces S3 and S4 facing the first core 21 and is narrowed at the central portion 22a located between the connection surfaces S3 and S4. Other features of the magnetic sensor 10C are identical to those of the magnetic sensor 10A according to the first embodiment, and thus like elements are denoted by like reference characters and redundant explanations thereof will be omitted.

With this shape of the second core 22, the sectional area of the second core 22 is reduced at the central portion 22a and thus magnetic saturation easily occurs at this portion.

Therefore, magnetic saturation occurs in a minute magnetic field, which can further enhance the sensitivity.

Figure 13A:
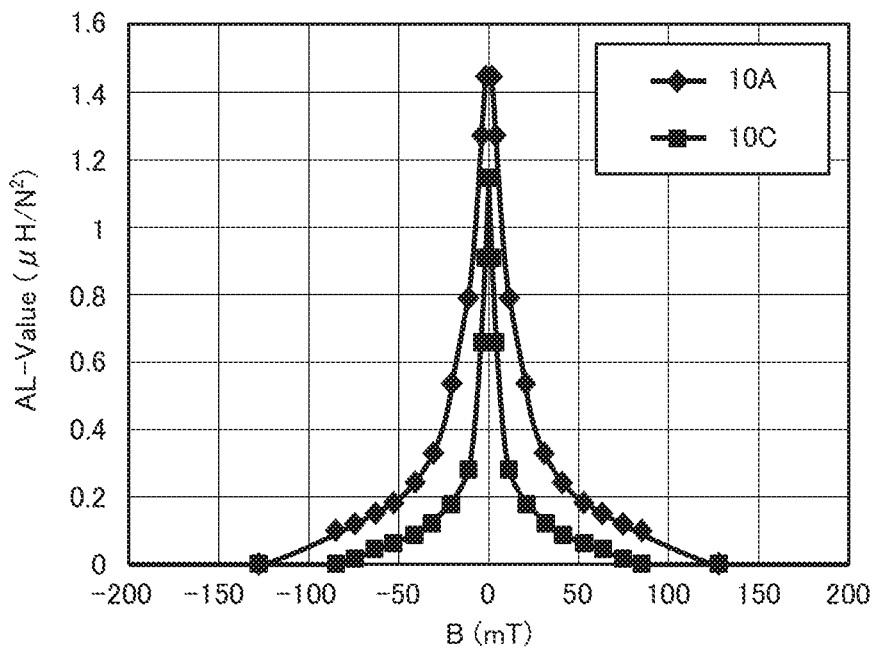
FIGS. 13A and 13B are graphs comparing magnetic characteristics between the magnetic sensor shown in FIG. 1 and the magnetic sensor shown in FIG. 12, where
Figure 13B:
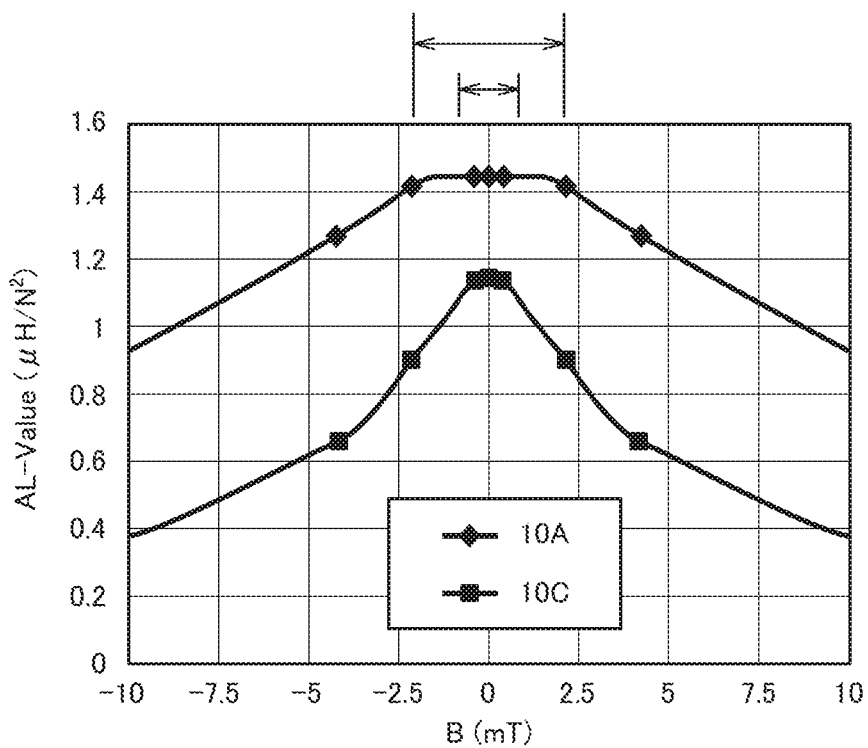

FIGS. 13A and 13B are graphs comparing magnetic characteristics between the magnetic sensor 10A and the magnetic sensor 10C. FIG. 13A shows characteristics in a range in which the magnetic flux density B is between −200 mT to 200 mT and FIG. 13B shows characteristics in a range in which the magnetic flux density B is between −10 mT to 10 mT.

As shown in FIGS. 13A and 13B, comparing the magnetic sensor 10A and the magnetic sensor 10B with each other, it is found that changes in the inductance (AL-Value) per turn of the coil 30 of the magnetic sensor 10C have a steeper inclination dL/dB. That is, because the sensitivity of a sensor to the magnetic flux density is defined by the magnitude of the inclination dL/dB, the shape in which the central portion 22a of the second core 22 is narrowed as in the magnetic sensor 10C can considerably enhance the sensitivity in a minute magnetic flux density region.

Furthermore, a region (a range indicated by arrows) in which the inductance does not change so much with respect to a change in the magnetic flux density B is narrower in the magnetic sensor 10C than that in the magnetic sensor 10A as shown in FIG. 13B. Accordingly, even when the external magnetic field is quite small, the magnetic sensor 10C can detect the external magnetic field.

The magnetic sensor 10C shown in FIG. 12 has a tapered shape in which the width of the second core 22 is gradually narrowed from end portions toward the central portion 22a. However, the shape is not limited thereto and a shape in which the width of the second core 22 is narrowed in a stepwise manner or in one step can be employed. However, the inclination dL/dB is larger in the tapered shape. While the width of the second core 22 is narrowed only at the central portion 22a in the magnetic sensor 10C shown in FIG. 12, the width can be entirely narrowed.

Figure 14:
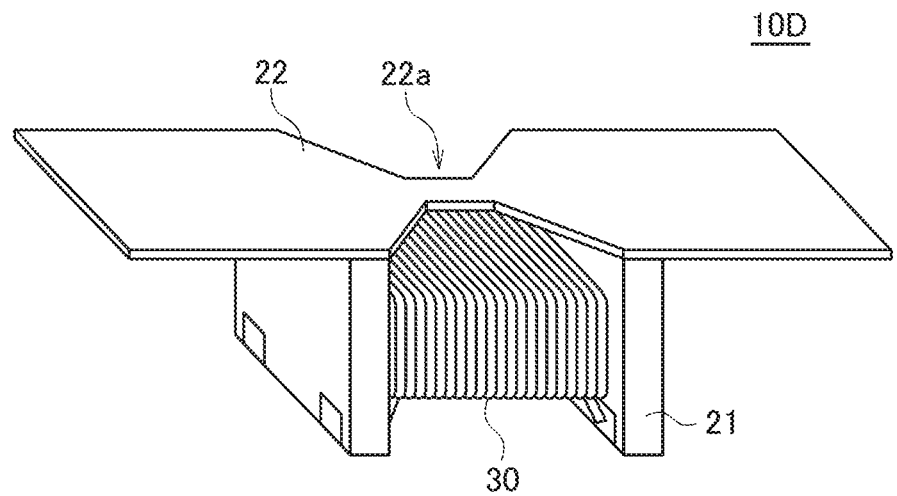
FIG. 14 is a perspective view showing a configuration of a magnetic sensor according to a fourth embodiment of the present invention.

FIG. 14 is a perspective view showing a configuration of a magnetic sensor 10D according to a fourth embodiment of the present invention.

The magnetic sensor 10D shown in FIG. 14 has a configuration having both the feature of the magnetic sensor 10B shown in FIG. 11 and the feature of the magnetic sensor 10C shown in FIG. 12. That is, the length of the second core 22 in the axial direction is larger than that of the first core 21 and the width of the second core 22 is narrowed at the central portion 22a. This can provide both the effect achieved by the magnetic sensor 10B and the effect achieved by the magnetic sensor 10C.

Figure 15:
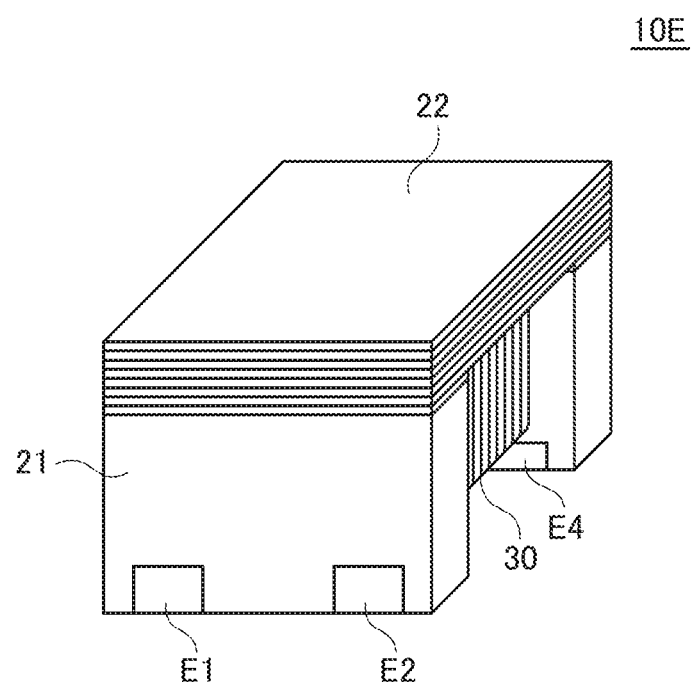
FIG. 15 is a perspective view showing a configuration of a magnetic sensor according to a fifth embodiment of the present invention.

FIG. 15 is a perspective view showing a configuration of a magnetic sensor 10E according to a fifth embodiment of the present invention.

The magnetic sensor 10E shown in FIG. 15 is different from the magnetic sensor 10A according to the first embodiment shown in FIG. 1 in that the second core 22 has a stack structure in the thickness direction. Other features of the magnetic sensor 10E are identical to those of the magnetic sensor 10A according to the first embodiment, and thus like elements are denoted by like reference characters and redundant explanations thereof will be omitted.

According to the magnetic sensor 10E, because the second core 22 has the stack structure, the sensitivity dL/dB is lowered; however, the second core 22 becomes unlikely to be saturated as a trade-off, which widens the range of an external magnetic field (magnetic flux density) that can be sensed. This is because the sectional area of the Fe/Co amorphous magnetic metal is equivalently increased due to staking. As is known in application of a silicon steel plate or the like, when a plurality of magnetic bodies are stacked, a minute gap occurs between the magnetic bodies and an eddy current is divided. Accordingly, loss due to eddy-current loss can be reduced.

Figure 16:
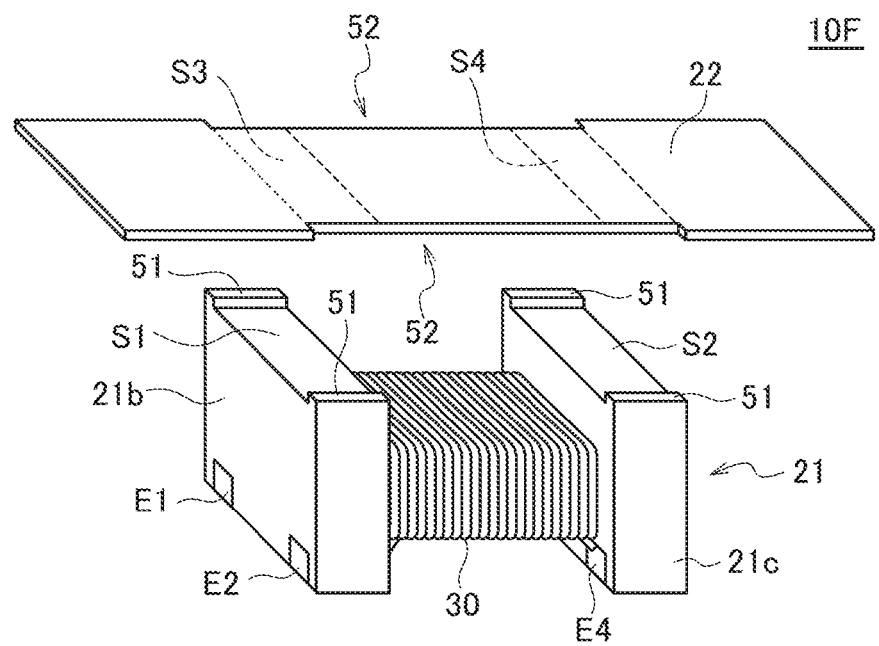
FIG. 16 is a perspective view showing a configuration of a magnetic sensor according to a sixth embodiment of the present invention.

FIG. 16 is a perspective view showing a configuration of a magnetic sensor 10F according to a sixth embodiment of the present invention.

In the magnetic sensor 10F shown in FIG. 16, engaging protrusions 51 are provided on the first connection surface S1 being the top surface of the flange portion 21b and the second connection surface S2 being the top surface of the flange portion 21c, respectively. The second core 22 is larger in the width on axially outer sides than the third connection surface S3 and the fourth connection surface S4, so that positions at which the connection surfaces S3 and S4 are located constitute an engaging recessed portion 52. Other features of the magnetic sensor 10F are identical to those of the magnetic sensor 10B according to the second embodiment, and thus like elements are denoted by like reference characters and redundant explanations thereof will be omitted.

With this configuration, the protrusions 51 provided on the first core 21 and the recessed portion 52 provided on the second core 22 engage with each other to enhance the joining property of these cores. In this case, it is possible to provide the adhesion layer G between the first core 21 and the second core 22 or omit the adhesion layer G. When the adhesion layer G is omitted, stress caused by contraction of the adhesive or the like is not applied to the second core 22 and thus the magnetic characteristics as designed can be provided.

Shapes of the protrusions 51 and the recessed portion 52 are not limited to examples shown in FIG. 16. For example, a plurality of the protrusions 51 can be provided in the axial direction on the first core 21 and a plurality of the recessed portions 52 can be provided in the axial direction on the second core 22 to more strongly engage the first core 21 and the second core 22 with each other. Alternatively, the protrusions 51 and the recessed portion 52 can both be formed in a serrated shape.

Figure 17:
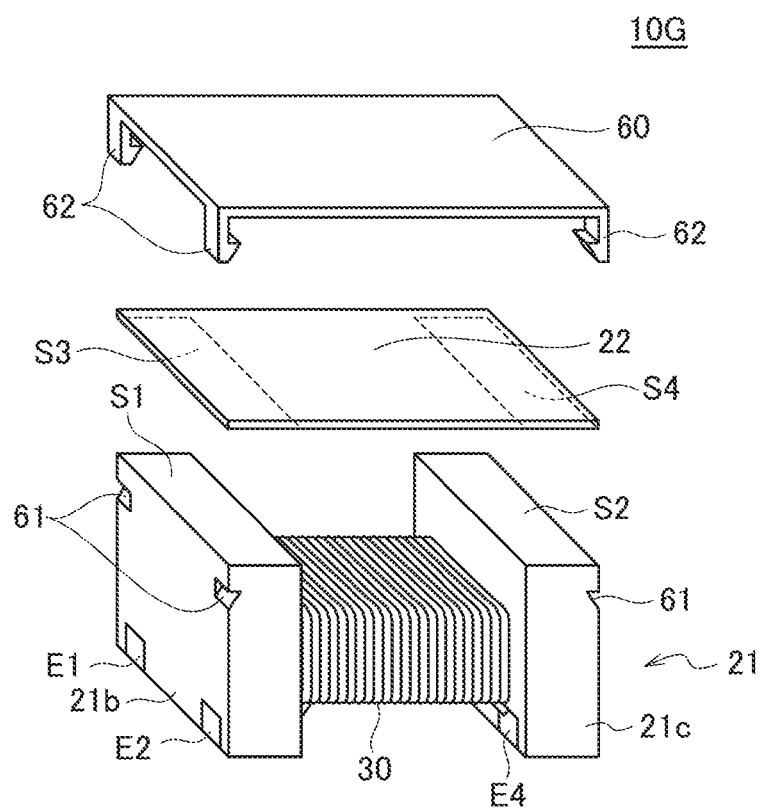
FIG. 17 is a perspective view showing a configuration of a magnetic sensor according to a seventh embodiment of the present invention.

FIG. 17 is a perspective view showing a configuration of a magnetic sensor 10G according to a seventh embodiment of the present invention.

The magnetic sensor 10G shown in FIG. 17 further includes a support member 60 that positions and fixes the second core 22 onto the first core 21. The support member 60 is made of, for example, a resin. In the seventh embodiment, notched portions 61 are provided on the flange portions 21b and 21c of the first core 21. When engagement portions 62 of the support member 60 are engaged with the notched portions 61 in a state where the second core 22 is sandwiched between the first core 21 and the support member 60, the second core 22 is fixed. Other features of the magnetic sensor 10G are identical to those of the magnetic sensor 10A according to the first embodiment, and thus like elements are denoted by like reference characters and redundant explanations thereof will be omitted.

With this configuration, the joining property between the first core 21 and the second core 22 can be enhanced also in the seventh embodiment. In this case, the adhesion layer G does not need to be provided between the first core 21 and the second core 22. Accordingly, stress caused by contraction of the adhesive or the like is not applied to the second core 22 and thus the magnetic characteristics as designed can be provided. Furthermore, because the second core 22 is covered by the support member 60, an effect that the second core 22 is protected by the support member 60 is also achieved.

Figure 18:
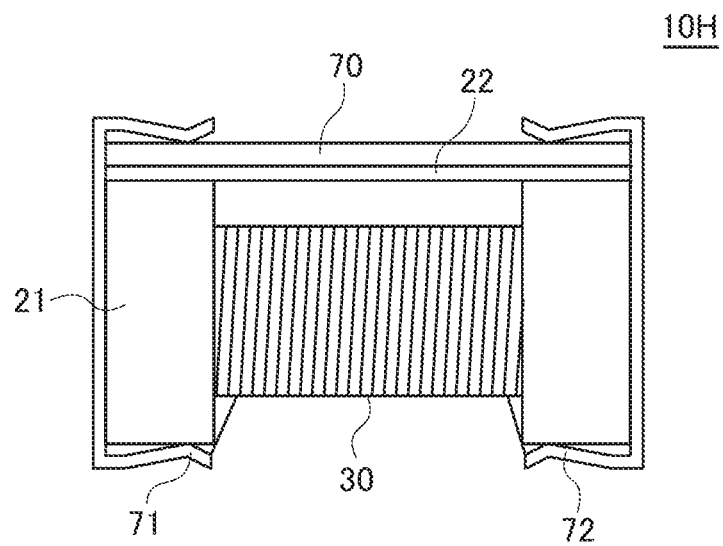
FIG. 18 is a side view showing a configuration of a magnetic sensor according to an eighth embodiment of the present invention.

FIG. 18 is a side view showing a configuration of a magnetic sensor 10H according to an eighth embodiment of the present invention.

The magnetic sensor 10H shown in FIG. 18 further includes a support member 70 that covers the second core 22, and leaf springs 71 and 72 that fix the support member 70. The support member 70 is made of, for example, a resin. In the eighth embodiment, the leaf spring 71 sandwiches the flange portion 21b of the first core 21 and the support member 70 and the leaf spring 72 sandwiches the flange portion 21c of the first core 21 and the support member 70. Accordingly, the second core 22 is positioned and fixed without using the adhesion layer G. Other features of the magnetic sensor 10H are identical to those of the magnetic sensor 10A according to the first embodiment, and thus like elements are denoted by like reference characters and redundant explanations thereof will be omitted.

Also with this configuration, the joining property between the first core 21 and the second core 22 can be enhanced and an identical effect to that of the magnetic sensor 10G according to the seventh embodiment can be achieved. Furthermore, the leaf springs 71 and 72 themselves can be used as terminal electrodes in the eighth embodiment.

Figure 19:
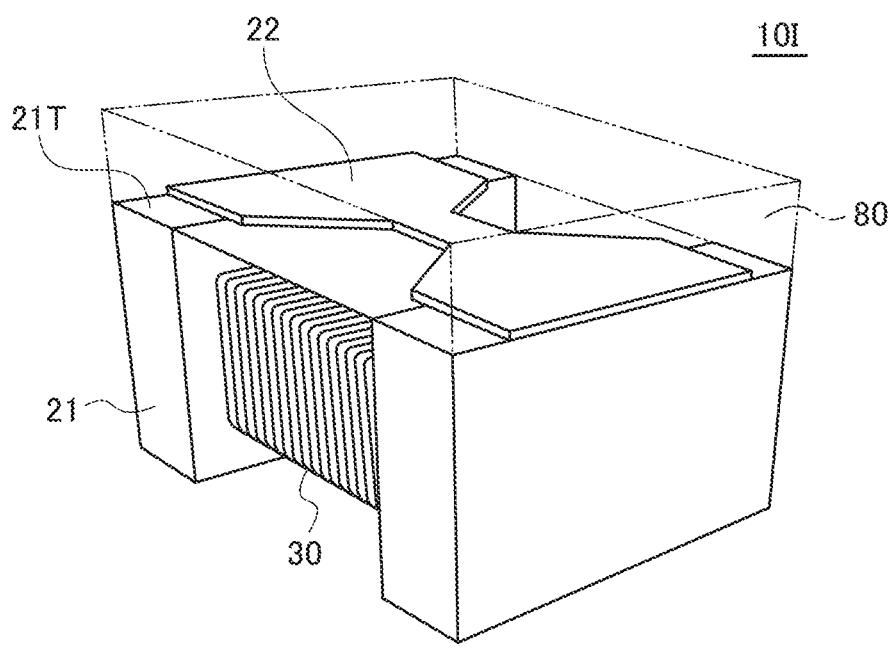
FIG. 19 is a perspective view showing a configuration of a magnetic sensor according to a ninth embodiment of the present invention.

FIG. 19 is a perspective view showing a configuration of a magnetic sensor 10I according to a ninth embodiment of the present invention.

Figure 20:
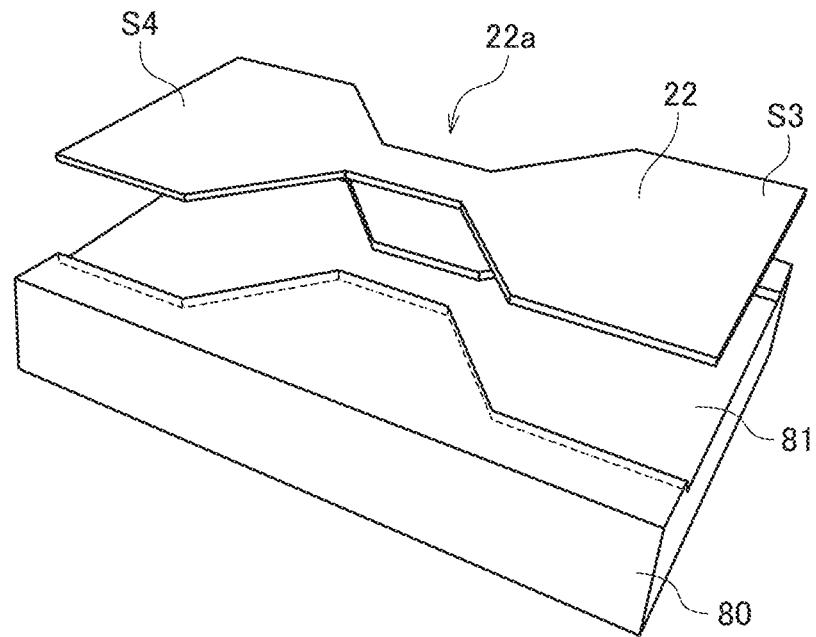
FIG. 20 shows a support member viewed from a side of a bonding surface.

The magnetic sensor 10I shown in FIG. 19 further includes a support member 80 that covers the second core 22. The support member 80 and the first core 21 are bonded with an adhesive. The support member 80 is made of, for example, a resin. The support member 80 has a recessed portion 81 that houses the second core 22 therein as shown in FIG. 20 showing a state of the support member 80 inverted and viewed from the side of a bonding surface. The depth of the recessed portion 81 is set to be equivalent to or slightly larger than the thickness of the second core 22. In the ninth embodiment, the widths of the connection surfaces S3 and S4 on the second core 22 are narrower than those of the connection surfaces S1 and S2 on the first core 21. In areas corresponding to differences in the widths, the support member 80 and the flange portions 21b and 21c of the first core 21 face directly each other without the second core 22 interposed therebetween. When an adhesive is coated on these areas to bond the support member 80 and the flange portions 21b and 21c of the first core 21, the first core 21 and the second core 22 can be positioned with respect to each other without an adhesive interposed therebetween.

With this configuration, in the ninth embodiment, the first core 21 and the second core 22 can be positioned with respect to each other with no engaging portion provided thereon and with no adhesive interposed therebetween. Furthermore, in the ninth embodiment, because the second core 22 has a shape narrowed at a central portion similarly in the magnetic sensor 10C according to the third embodiment and the recessed portion of the support member 80 has a shape corresponding thereto, the second core 22 does not fall off after the support member 80 is bonded to the first core 21.

Figure 21:
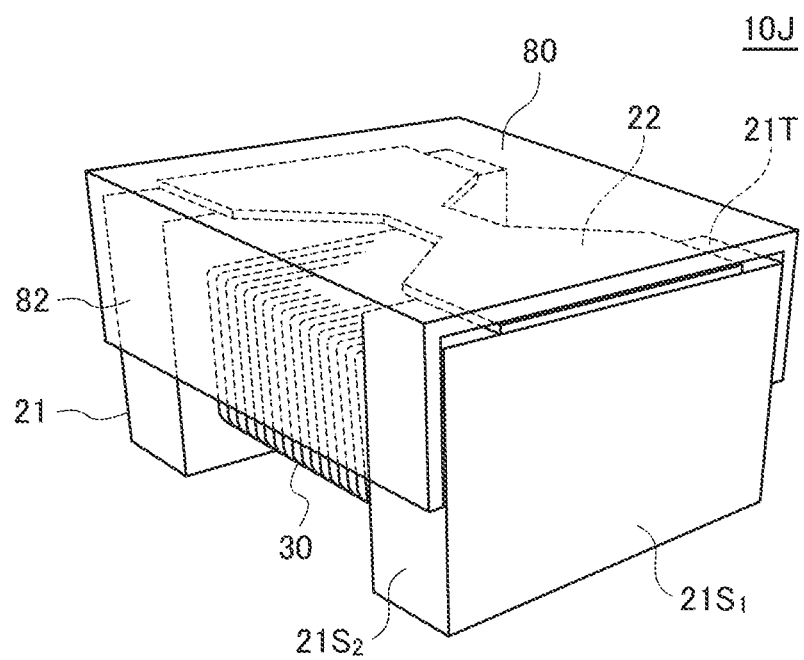
FIG. 21 is a perspective view showing a configuration of a magnetic sensor according to a tenth embodiment of the present invention.

FIG. 21 is a perspective view showing a configuration of a magnetic sensor 10J according to a tenth embodiment of the present invention.

The magnetic sensor 10J shown in FIG. 21 is different from the magnetic sensor 10I according to the ninth embodiment shown in FIG. 19 in that the support member 80 has a different shape. Other features of the magnetic sensor 10J are identical to those of the magnetic sensor 10I according to the ninth embodiment, and thus like elements are denoted by like reference characters and redundant explanations thereof will be omitted.

The support member 80 used in the tenth embodiment includes side plate portions 82 that cover parts of side surfaces $21S_2$ of the flange portions 21b and 21c, respectively. The side surfaces $21S_2$ are surfaces substantially parallel to the axial direction of the winding core portion 21a and substantially orthogonal to a top surface 21T. In this way, in the tenth embodiment, the support member 80 has a U-shape viewed in the axial direction. Accordingly, the support member 80 and the first core 21 can be fixed to each other at the side surfaces $21S_2$ of the flange portions 21b and 21c. Therefore, for example, when an adhesive is coated between the side surfaces $21S_2$ of the flange portions 21b and 21c and the side plate portions 82 of the support member 80, the flange portions 21b and 21c and the support member 80 can be fixed to each other. In this case, an adhesive does not need to be coated on the top surface 21T of the flange portions 21b and 21c, and thus the width of the second core 22 can be further increased. Alternatively, the support member 80 and the flange portions 21b and 21c can be fixed to each other by sandwiching the flange portions 21b and 21c with a pair of the side plate portions 82 using the spring property of the support member 80. In this case, the adhesive can be omitted.

In the tenth embodiment, because the support member 80 is fixed at the side surfaces $21S_2$ of the flange portions 21b and 21c, the recessed portion 81 does not need to be provided in the support member 80. FIG. 21 shows the support member 80 in which the recessed portion 81 is not provided.

Figure 22:
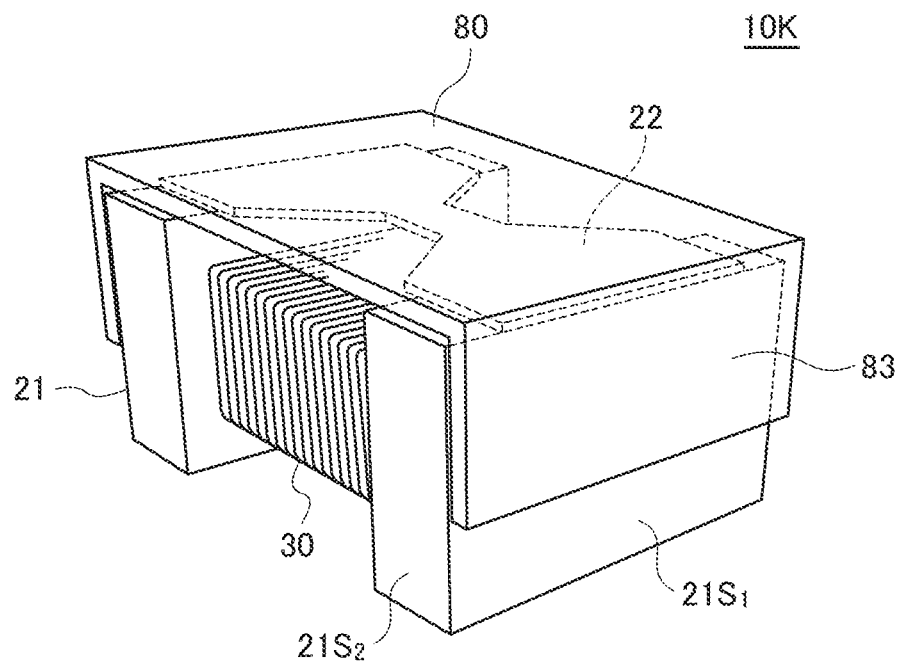
FIG. 22 is a perspective view showing a configuration of a magnetic sensor according to an eleventh embodiment of the present invention.

FIG. 22 is a perspective view showing a configuration of a magnetic sensor 10K according to an eleventh embodiment of the present invention.

The support member 80 used in the eleventh embodiment includes side plate portions 83 that cover parts of side surfaces $21S_1$ of the flange portions 21b and 21c, respectively. The side surfaces $21S_1$ are surfaces substantially orthogonal to the winding core portion 21a. The support member 80 thus has a U-shape viewed in a direction intersecting with the axial direction in the eleventh embodiment. Accordingly, an identical effect to that of the magnetic sensor 10J according to the tenth embodiment described above can be achieved.

Figure 23:
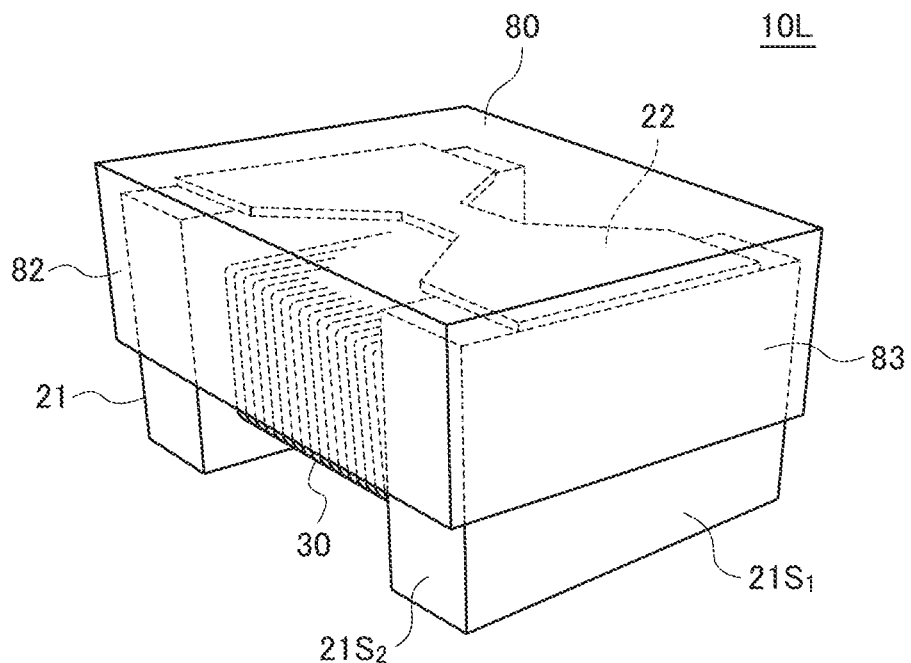
FIG. 23 is a perspective view showing a configuration of a magnetic sensor according to a twelfth embodiment of the present invention.

FIG. 23 is a perspective view showing a configuration of a magnetic sensor 10L according to a twelfth embodiment of the present invention.

The support member 80 used in the twelfth embodiment includes both the side plate portions 82 and 83 that cover parts of the side surfaces $21S_1$ and $21S_2$ of the flange portions 21b and 21c. That is, the support member 80 has a cap-shape structure. In the twelfth embodiment, because the support member 80 having the cap-shape structure is used, fall-off of the support member 80 can be securely prevented.

Furthermore, because the second core 22 is entirely housed, the second core 22 can be more securely protected.

Figure 24:
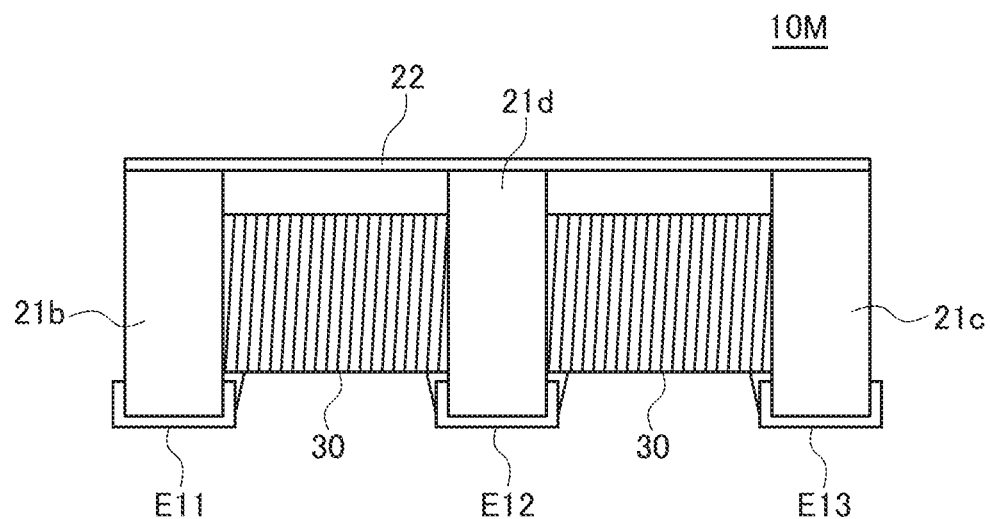
FIG. 24 is a side view showing a configuration of a magnetic sensor according to a thirteenth embodiment of the present invention.

FIG. 24 is a side view showing a configuration of a magnetic sensor 10M according to a thirteenth embodiment of the present invention.

The magnetic sensor 10M according to the thirteenth embodiment is different from those according to the embodiments described above in that a third flange portion 21d is provided on the first core 21. The flange portion 21d is located between the flange portion 21b and the flange portion 21c in the axial direction, so that the winding core portion 21a is divided into two. The coil 30 is wound around each of the winding core portion 21a divided into two. Furthermore, terminal electrodes E11 to E13 to which the coils 30 are connected are formed on the flange portions 21b, 21c, and 21d, respectively.

The second core 22 is placed to cover surfaces of the flange portions 21b, 21c, and 21d. Accordingly, even when the length in the axial direction of the first core 21 is large, flexure of the second core 22 made of an amorphous magnetic metal or the like can be prevented. Furthermore, because the coil 30 is wound in a divided manner, the parasitic capacitance occurring on the coil 30 can be reduced.

Figure 25:
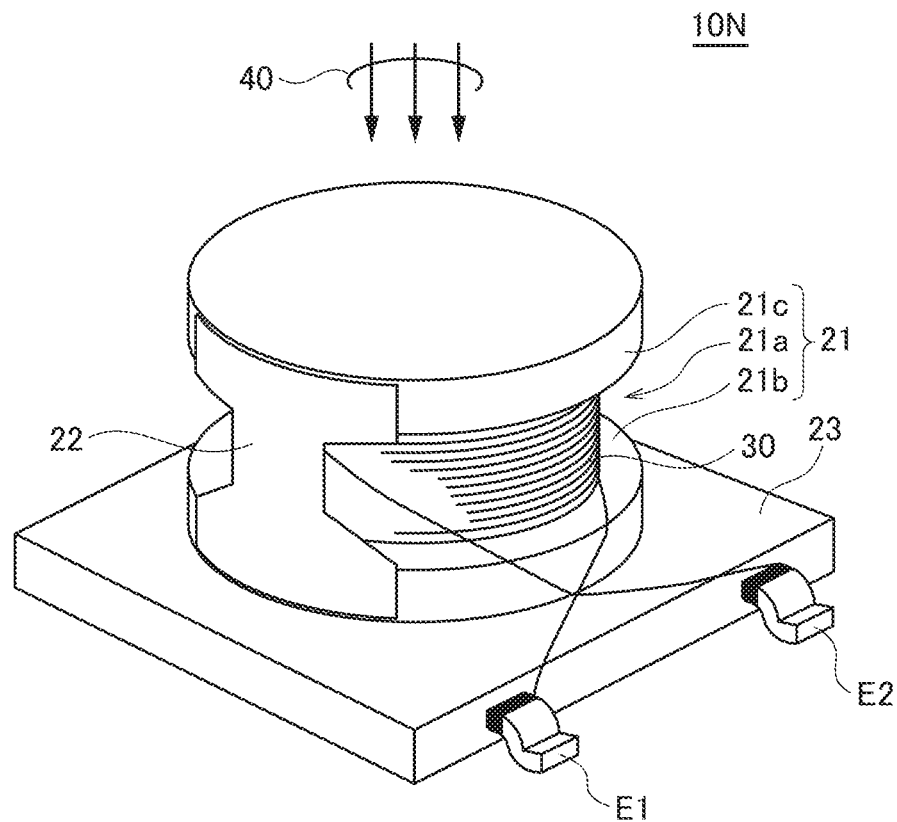
FIG. 25 is a perspective view showing a configuration of a magnetic sensor according to a fourteenth embodiment of the present invention.

FIG. 25 is a perspective view showing a configuration of a magnetic sensor 10N according to a fourteenth embodiment of the present invention.

The magnetic sensor 10N according to the fourteenth embodiment is characterized in that the shapes of the winding core portion 21a and the flange portions 21b and 21c viewed in the axial direction are circular and that the second core 22 is bent along the shapes of the flange portions 21b and 21c. The magnetic sensor 10N according to the fourteenth embodiment includes a support substrate 23 and the first core 21 is mounted to stand on the support substrate 23 in such a manner that the axial direction is orthogonal to the support substrate 23. The terminal electrodes E1 and E2 are provided on the support substrate 23 and both ends of the coil 30 are connected to the corresponding terminal electrodes E1 and E2, respectively. As described above, it is not essential in the present invention that the terminal electrodes are provided on the flange portions 21b and 21c.

With this configuration, the magnetic sensor 10N can be mounted in such a manner that the axial direction becomes perpendicular to a mounting board (not shown) and thus the external magnetic field 40 that is perpendicular to the mounting board can be detected.

In this way, in the present invention, the first core 21 can be circular when viewed in the axial direction. While the second core 22 needs to be bend in this case, the second core 22 has quite a thin thickness and can be easily bent. The shape of the first core 21 can be other shapes, such as a hexagonal shape viewed in the axial direction.

Figure 26:
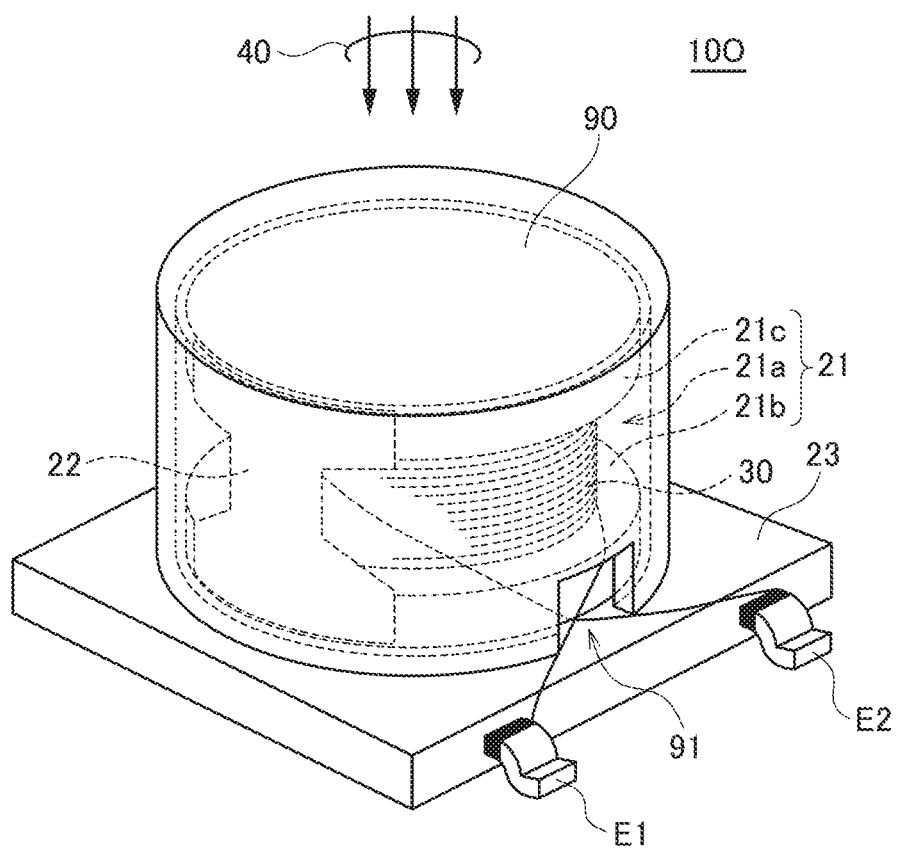
FIG. 26 is a perspective view showing a configuration of a magnetic sensor according to a fifteenth embodiment of the present invention.

FIG. 26 is a perspective view showing a configuration of a magnetic sensor 100 according to a fifteenth embodiment of the present invention.

The magnetic sensor 100 according to the fifteenth embodiment has a support member 90 added to the magnetic sensor 10N shown in FIG. 25, in which the support member 90 covers almost the entirety of the first core 21, the second core 22, and the coil 30. The support member 90 is fixed to the support substrate 23 and the coil 30 is drawn out through an opening 91. In this way, when the support member 90 that covers almost the entirety of the first core 21, the second core 22, and the coil 30 is used, effects that the second core 22 can be positioned on an outer circumferential portion of the first core 21 and that the first core 21, the second core 22, and the coil 31 are protected by the support member 90 can be achieved.

While the preferred embodiments of the present invention have been described, the present invention is not limited thereto. Thus, various modifications may be made without departing from the gist of the invention, and all of the modifications thereof are included in the scope of the present invention.

What is claimed is:

1. An inductance element for using a magnetic sensor comprising:
   a first core made of a ferrite, the first core having first and second connection surfaces;
   a second core made of an amorphous magnetic metal, the second core having a third connection surface facing the first connection surface and a fourth connection surface facing the second connection surface; and
   a coil wound around the first core between the first connection surface and the second connection surface,
   wherein the first core reaches magnetic saturation at a higher magnetic field intensity than that of the second core, and
   wherein the second core has a higher magnetic permeability than that of the first core.

2. The inductance element for using a magnetic sensor as claimed in claim 1, wherein
   the first core including a winding core portion around which the coil is wound and the first and second flange portions provided on both ends of the winding core portion in an axial direction, respectively,
   the first flange portion has a first terminal electrode to which one end of the coil is connected,
   the second flange portion has a second terminal electrode to which other end of the coil is connected,
   the first flange portion has the first connection surface that is parallel to the axial direction, and
   the second flange portion has the second connection surface that is parallel to the axial direction.

3. The inductance element for using a magnetic sensor as claimed in claim 2, wherein the coil includes first and second coils, at least parts of the first and second coils are bifilar wound.

4. The inductance element for using a magnetic sensor as claimed in claim 2, wherein the coil includes first and second coils, numbers of turns of the first and second coils are different from each other.

5. The inductance element for using a magnetic sensor as claimed in claim 2, wherein the second core has a plate-shaped and covers the first and second connection surfaces.

6. The inductance element for using a magnetic sensor as claimed in claim 5, wherein a width of the second core in a direction orthogonal to the axial direction is narrower at a central portion located between the third connection surface and the fourth connection surface than those at the third and fourth connection surfaces.

7. The inductance element for using a magnetic sensor as claimed in claim 5, wherein the second core has a stack structure in a thickness direction.

8. The inductance element for using a magnetic sensor as claimed in claim 5, wherein a length of the second core in the axial direction is larger than that of the first core in the axial direction.

9. The inductance element for using a magnetic sensor as claimed in claim 5, wherein the first core and the second core are positioned with respect to each other without an adhesive interposed therebetween.

10. The inductance element for using a magnetic sensor as claimed in claim 9, further comprising a support member that positions the second core with respect to the first core, wherein the support member has an engaging portion that engages with the first core, thereby the second core is sandwiched between the support member and the first core.

11. The inductance element for using a magnetic sensor as claimed in claim 9, further comprising a support member that positions the second core with respect to the first core,
    wherein the support member has an adhesion surface on which a recessed portion housing the second core therein is provided, and
    wherein the adhesion surface of the support member is bonded to the first and second connection surfaces of the first core, thereby the second core is sandwiched between the recessed portion of the support member and the first core.

12. The inductance element for using a magnetic sensor as claimed in claim 5,
    wherein the first core further includes a third flange portion that is located between the first flange portion and the second flange portion in the axial direction, and
    wherein the second core is placed to cover the first to third flange portions.

13. A current sensor comprising:
    a bus bar through which a current to be measured flows;
    an inductance element for using a magnetic sensor placed near the bus bar, the inductance element comprising:
      a first core made of a ferrite, the first core having first and second connection surfaces;
      a second core made of an amorphous magnetic metal, the second core having a third connection surface facing the first connection surface and a fourth connection surface facing the second connection surface; and
      a coil wound around the first core between the first connection surface and the second connection surface,
      wherein the first core reaches magnetic saturation at a higher magnetic field intensity than that of the second core, and
      wherein the second core has a higher magnetic permeability than that of the first core; and
    a detection circuit that monitors a voltage appearing between both ends of the coil.

* * * * *